(12) United States Patent
Lesso

(10) Patent No.: US 11,233,487 B1
(45) Date of Patent: Jan. 25, 2022

(54) AMPLIFIERS

(71) Applicant: Cirrus Logic International Semiconductor Ltd., Edinburgh (GB)

(72) Inventor: John Paul Lesso, Edinburgh (GB)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 17/014,283

(22) Filed: Sep. 8, 2020

(51) Int. Cl.
| | |
|---|---|
| *H03F 99/00* | (2009.01) |
| *H03F 3/217* | (2006.01) |
| *H03M 3/00* | (2006.01) |
| *H04R 3/00* | (2006.01) |
| *H04R 17/00* | (2006.01) |

(52) U.S. Cl.
CPC ............ *H03F 3/217* (2013.01); *H03M 3/436* (2013.01); *H04R 3/00* (2013.01); *H04R 17/00* (2013.01); *H03F 2200/03* (2013.01); *H03F 2200/331* (2013.01)

(58) Field of Classification Search
CPC ...................................................... H03F 99/00
See application file for complete search history.

(56) References Cited

U.S. PATENT DOCUMENTS

| | | | | |
|---|---|---|---|---|
| 4,115,865 A | * | 9/1978 | Beauvais | G01S 7/292 324/76.33 |
| 5,268,926 A | * | 12/1993 | Sebilet | H04J 13/10 375/142 |
| 9,263,992 B1 | * | 2/2016 | Breece, III | H03F 3/2173 |
| 2015/0195651 A1 | * | 7/2015 | Boehlke | H04R 5/04 381/307 |
| 2020/0161970 A1 | * | 5/2020 | Takida | H02M 1/32 |

FOREIGN PATENT DOCUMENTS

| | | |
|---|---|---|
| DE | 10115386 A1 | 10/2002 |
| EP | 2506426 A1 | 10/2012 |

OTHER PUBLICATIONS

Combined Search and Examination Report under Sections 17 and 18(3), UKIPO, Application No. GB2014082.8, dated Mar. 9, 2021.
International Search Report and Written Opinion of the International Searching Authority, Application No. PCT/GB2021/052218, dated Nov. 5, 2021.
Kyehyung Lee et al.: "Enhanced split-architecture delta-sigma ADCs", Analog Integrated Circuits and Signal Processing, Kluwer Academic Publishers, vol. 56, No. 3, Feb. 26, 2008 (Feb. 26, 2008), pp. 251-257.

* cited by examiner

*Primary Examiner* — Olisa Anwah
(74) *Attorney, Agent, or Firm* — Jackson Walker L.L.P.

(57) ABSTRACT

The application describes method and apparatus for amplification. An amplifier circuit (300) is described for driving a load (101) connected between first and second output nodes (103*p*, 103*n*) based on an input signal (Sin). The amplifier circuit includes first and second signal paths for generating respective first and second driving signals (Soutp and Soutn) at the first and second output nodes, each of the first and second signal paths comprising a respective sigma-delta modulator (301*p*, 301*n*). A correlation controller (302) is configured to control the first and second signal paths to provide correlation between at least some noise components of the first and second driving signals.

20 Claims, 4 Drawing Sheets

AMPLIFIERS

The field of representative embodiments of this disclosure relates to methods, apparatus and/or implementations concerning or relating to amplifiers, in particular amplifiers for driving loads such as transducers.

Many electronic devices include amplifier circuits for generating driving signals for driving a load, for instance for driving audio signals into an audio output transducer such as a loudspeaker.

In some applications, the amplifier circuit may be configured to drive the load, e.g. transducer, in a bridge-tied-load (BTL) configuration. In a BTL configuration, both sides of the load are driven with respective driving signals that are complementary to one another so as to apply the relevant driving voltage across the load.

FIG. 1 illustrates one example of an amplifier circuit 100 for driving a transducer 101, in this example a speaker, in a BTL configuration. FIG. 1 illustrates the amplifier circuit comprises respective first and second drivers or amplifiers 102p and 102n for driving respective first and second output terminals 103p and 103n, coupled to opposite sides of the transducer 101, with complementary driving signals Soutp and Soutn so as to apply an output signal Vout across the load 101, based on an input signal Sin. The drivers 102p and 102n may, for example, each comprise a switching output stage such as a class-D output stage.

In some examples, the input signal Sin, which may be a digital signal, may be modulated and the modulated signal used to provide an input to the drivers 102p and 102n. In the example of FIG. 1 the amplifier circuit includes a sigma-delta modulator (SDM) 104 which receives the input signal Sin and generates a modulated signal Sm, which may for instance by a PWM or PDM signal.

FIG. 2 illustrates one example of the general structure of an SDM 104. The input signal Sin is combined with a feedback signal Sfb and input to a loop filter 201. The output from the loop filter 201 is supplied to a quantizer 202, e.g. a comparator, and the output from the quantizer provides the modulated signal Sm. The feedback signal Sfb is tapped from the output modulated signal and may be subtracted from the input signal Sin to provide negative feedback.

As will be understood by one skilled in the art, the SDM 104 can provide noise shaping, which means that the quantisation noise in the signal band of interest may be relatively low, but there may be relatively significant high-frequency noise, which typically is outside the signal band of interest. FIG. 2 also illustrates an example of the noise transfer function of the SDM, i.e. the noise content in modulated signal Sm as a function of frequency.

Referring back to FIG. 1, to generate the differential driving signals Soutp and Soutn, the respective drivers 102p and 102n may be provided with differential inputs Smp and Smn. FIG. 1 illustrates that a version of the modulated signal Sm may be used as the first input Smp and a version of the modulated signal Sm may be inverted by inverter 105 to provide the second input Smn. Alternatively, the modulated signal Sm could be supplied to both drivers 102p and 102n which may be configured as inverting and non-inverting amplifiers respectively.

Whilst such an amplifier arrangement can provide good performance, an issue can arise when the load impedance of the load is relatively low, as may be the case in some applications, for instance for driving piezo output transducers as may increasing be used for haptic drivers and the like. When driving a relatively low impedance load, folding back of the power of the out-of-band noise can result in a relatively high power dissipation. Generally, it is desirable to reduce power consumption, especially in portable, battery powered devices, and thus such high power dissipation is undesirable. Designing and operating the amplifier circuit to prevent such folding back of the out-of-band power may however impose relatively high power and/or bandwidth requirements.

Embodiments of the present disclosure relate to improved amplifier arrangements and methods of amplification which at least mitigate at least some of the above mentioned issues.

According to an aspect of the disclosure there is provided an amplifier circuit for, in use, driving a load connected between first and second output nodes with respective first and second driving signals based on an input signal. The amplifier circuit comprises: a first signal path for generating the first driving signal at the first output node, the first signal path comprising a first sigma-delta modulator;

a second signal path for generating the second driving signal at the second output node, the second signal path comprising a second sigma-delta modulator; and a correlation controller for controlling the first and second signal paths to provide correlation between at least some noise components of the first and second driving signals.

In some examples, the correlation controller may comprise a cross-coupler configured to: generate a first cross-coupling signal based on signal content of the first signal path; generate a second cross-coupling signal based on signal content of the second signal path; add the first cross-coupling signal to the second signal path; and add the second cross-coupling signal to the first signal path.

In some examples, each of the first and second sigma-delta modulators may comprise a respective loop filter and a quantizer.

In examples where the correlation controller comprises a cross-coupler, the cross-coupler may be configured to generate the first cross-coupling signal based on a first quantization error signal derived from the first signal path and to generate the second cross-coupling signal based on a second quantization error signal derived from the second signal path. The cross-coupler may be configured to derive the first and second quantization error signals by determining a difference between an output of the loop filter and an output of the quantizer for the respective first and second sigma-delta modulators. In some example the cross-coupler may comprise first and second processing modules for applying a defined function to the first and second quantization error signals respectively to generate the respective first and second cross-coupling signals. The first and second processing modules may each comprise a filter for filtering the relevant quantization error signal and a gain element for applying a gain based on a predefined coupling coefficient.

The cross-coupler may be configured to: add the first cross-coupling signal to the second signal path between the loop filter and quantizer of the second sigma-delta modulator; and add the second cross-coupling signal to the first signal path between the loop filter and quantizer of the first sigma-delta modulator.

In some examples, the correlation controller may be configured to apply a common dither signal to the first and second signal paths. The amplifier circuit may comprise a dither generator for generating the common dither signal. Where each of the first and second sigma-delta modulators comprises a respective loop filter and a quantizer, the correlation controller may be configured to add the common dither signal to the respective first and second signal path between the loop filter and quantizer of the first and second sigma-delta modulators respectively.

In some examples, the first and second signal paths may be coupled to an input node for receiving the input signal. The second signal path may comprise an inverter upstream of the second sigma-delta modulator.

In some examples, the first and second signal paths may comprise respective first and second output drivers between the respective first and second sigma-delta modulator and the respective first and second output node. The first and second output drivers may comprise class-D output stages.

The amplifier circuit may be implemented as an integrated circuit.

Aspects also relate to an amplifier circuit further comprising an output transducer connected between the first and second output nodes. The output transducer may comprise a piezoelectric output transducer.

Aspects also relate to an electronic device comprising the amplifier circuit of any of the embodiments described herein.

In another aspect there is provided an amplifier circuit for, in use, driving a load connected between first and second output nodes with respective first and second driving signals based on an input signal, the amplifier circuit comprising:
 a first signal path for generating the first driving signal, the first signal path comprising a first sigma-delta modulator with a first loop filter and a first quantizer;
 a second signal path for generating the second driving signal at the second output node, the second signal path comprising a second sigma-delta modulator with a second loop filter and a second quantizer; and
 a cross-coupler configured to:
  add a first coupling signal derived from the first sigma-delta modulator to an input of the second quantizer; and
  add a second coupling signal derived from the second sigma-delta modulator to an input of the first quantizer.

In a further aspect there is provided an amplifier circuit for, in use, driving a load connected between first and second output nodes with respective first and second driving signals based on an input signal, the amplifier circuit comprising:
 a first signal path for generating the first driving signal, the first signal path comprising a first sigma-delta modulator;
 a second signal path for generating the second driving signal at the second output node, the second signal path comprising a second sigma-delta modulator; and
 a correlation controller configured to apply a common dither signal to the first and second sigma-delta modulators.

Unless expressly indicated to the contrary, any of the various features of the various implementations discussed herein may be implemented together with any one or more of the other described features in any and all suitable combinations.

For a better understanding of examples of the present disclosure, and to show more clearly how the examples may be carried into effect, reference will now be made, by way of example only, to the following drawings in which.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As discussed above with respect to FIG. 1, in some applications, high frequency noise due to a sigma-delta modulator (SDM) in a signal path of an amplifier circuit may be undesirable. Embodiments of the present disclosure relate to amplifier circuits that mitigate for the effects of the high frequency noise.

Embodiments of the present invention relate to amplifier arrangements operable in a bridge-tied-load configuration to drive a load with differential driving signals. Embodiments of the present invention operate to introduce some correlation into the differential driving signals, in particular for noise components such as the high frequency out-of-band noise, so as to the reduce the differential power dissipation across the load. Embodiments of the present invention thus control the generation of the differential driving signals so at least some noise components of the differential driving signals, i.e. components that do not correspond to the signal content of the input signal Sin, are correlated in the two driving signals, i.e. these signal components vary in the same way in each driving signal. Such correlated signal components are effectively common to both driving signals and thus do not appear across the load.

Therefore if at least some noise components, especially the high-frequency components such as the out-of-band noise, are correlated, this can reduce the power dissipation across the load due to such noise components.

Figure 3:
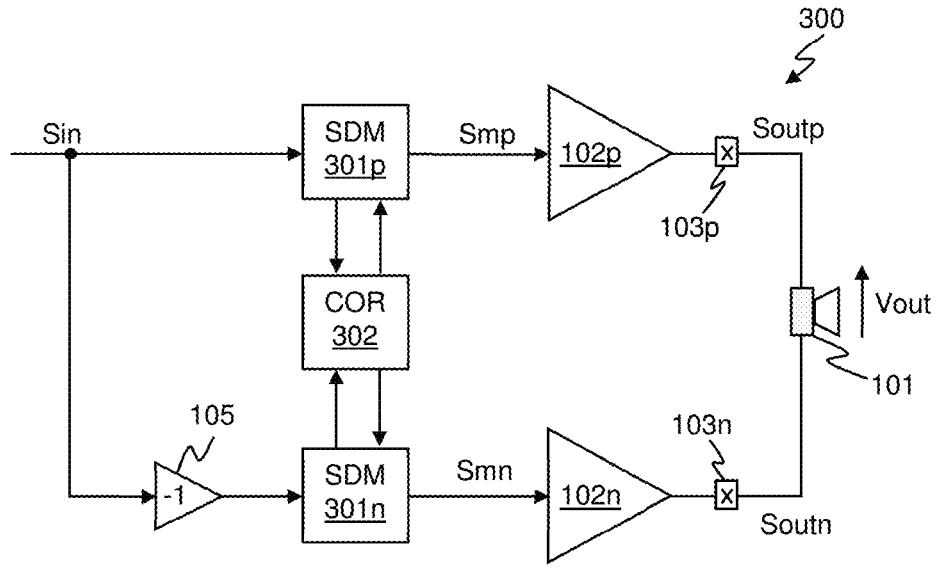
FIG. 3 illustrates an amplifier arrangement for driving a bridge-tied-load having a correlation controller according to an embodiment.

FIG. 3 illustrates an amplifier circuit 300 according to an embodiment. The amplifier circuit 300, like that discussed with reference to FIG. 1, has first and second drivers 102$p$ and 102$n$ in first and second differential signal paths for outputting respective driving signals Soutp and Soutn at output terminals 103$p$ and 103$n$ for driving a bridge-tied-load 101. In the embodiments of FIG. 3, however, each of the first and second signal paths includes a respective sigma-delta-modulator (SDM) 301$p$ and 301$n$. The first SDM 301$p$ receives the input signal Sin and generates a first modulated signal Smp for the first driver 102$p$. The second SDM 301$n$ receives, in this example, an inverted version of the input signal Sin, e.g. from inverter 105, and generates a second modulated signal Smn for the second driver 102$p$.

The amplifier circuit also comprises a correlation controller 302 operable to provide at least some correlation between the first and second driving signals Soutp and Soutn. In the example of FIG. 3 the correlation controller 302 is configured to control operation of the first and second SDMs so as to provide at least some correlation between the first and second modulated signals Smp and Smn, and hence the first and second driving signals Soutp and Soutn. There are various ways that the SDMs 301p and 301n may be controlled to introduce some correlation, as will be discussed in more detail below.

The correlation controller 302 thus operates such that at least some of the out-of-band power of the driving signals Soutp and Soutn is correlated and thus does not appear as a differential component across the load.

Figure 1:
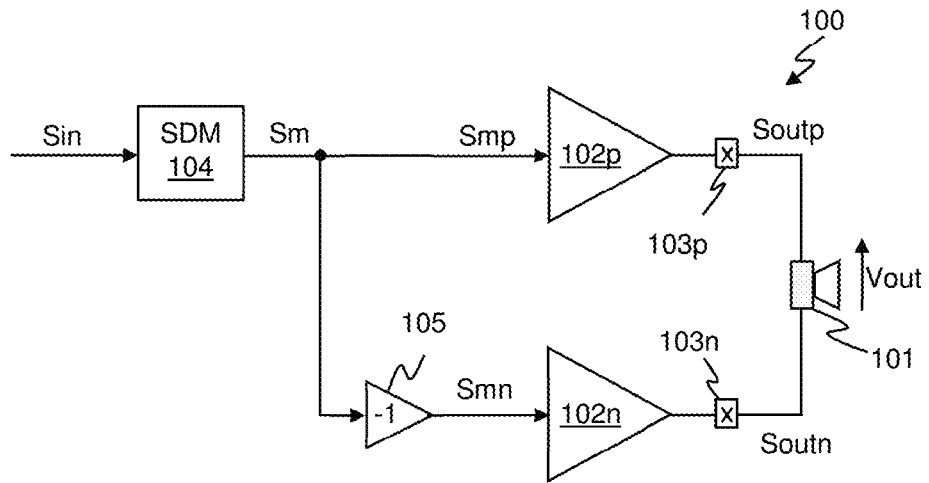
FIG. 1 illustrates an amplifier arrangement for driving a bridge-tied-load.

Referring back to FIG. 1, consider that the input signal Sin comprises a signal of interest as at a signal frequency fsig. Simplistically, the operation of the SMD 104 may generate the modulated signal Sm with a signal component at the signal frequency fsig, but there may also be a high-frequency noise component, e.g. at a frequency fnoise. In the example of FIG. 1, the modulated signal Sm is used to drive the first driver 102p and inverted to drive the second driver 102p. Both the signal component of interest, and the noise, will thus appear differentially across the load 101, which can lead to an undesirably high power dissipation.

The amplifier circuit of FIG. 3 thus comprises two SDMs 301p and 301n, for generating respective modulated signals Smp and Smn, and the correlation controller 302 operates to provide at least some correlation to noise components of these modulated signals Smp and Smn, whilst having no significant effect on the signal component of interest. Thus, whilst the signal component at the signal frequency fsig varies inversely in the driving signals Soutp and Soutn, at least some of noise is correlated in the driving signals Soutp and Soutn. Thus, in the simplistic example discussed above a noise component at the noise frequency fnoise provides a correlated variation in each of the driving signals, which thus does not appear as a differential signal across the load.

It should be noted that if the amplifier circuit of FIG. 3, with respective SDMs 301p and 301n in the first and second signal paths, were operated without any deliberate correlation control, then the high frequency noise in the respective modulated signals Smp and Smn would be uncorrelated. As such the noise components in the driving signals Soutp and Soutn would be uncorrelated, and there would still be a significant amount of high frequency noise in the differential signal across the load. Providing correlation between the first and second modulated signals Smp and Smn, and hence the driving signals Soutp and Soutn, can reduce the power of the high frequency noise in the differential signal Vout across the load.

In some embodiments the correlation controller 302 may be configured to introduce some correlation in the modulated signals Smp and Smn by applying correlated dither to the first and second SDMs 301p and 301n.

As one skilled in the art will understand, it is known that dither may be applied to an SDM to avoid unwanted tones in the output modulated signal. For instance, if an input signal at a constant signal level were input to an SDM for a period of time, the cyclic operation of the SDM may produce a modulated signal with a repeating modulation sequence and this may give rise to unwanted tones. To prevent such unwanted tones, dither may be applied to the SDM. The dither applied is a high frequency modulation out of the signal band of interest, which is configured so as to be sufficiently non-repetitive, e.g. random or pseudo-random or the like, so as to disrupt any unwanted tones. In effect, dither can be seen as a deliberately introduced noise component that is added within the feedback loop of the SDM so as to spread the high frequency power over a range of different frequencies to avoid tones.

Figure 2:
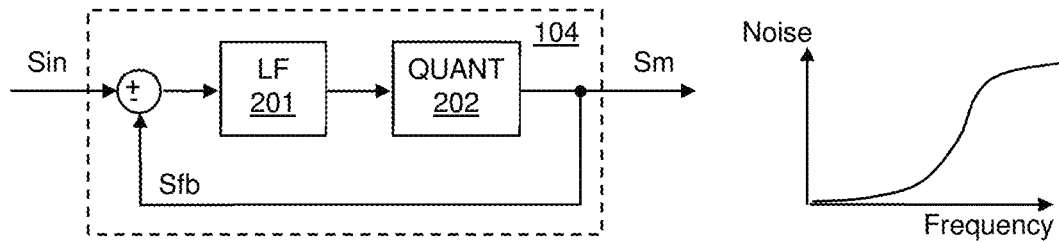
FIG. 2 illustrates an example of a sigma-delta modulator as may be used in the amplifier of FIG. 1 and an example noise transfer function.
Figure 4:
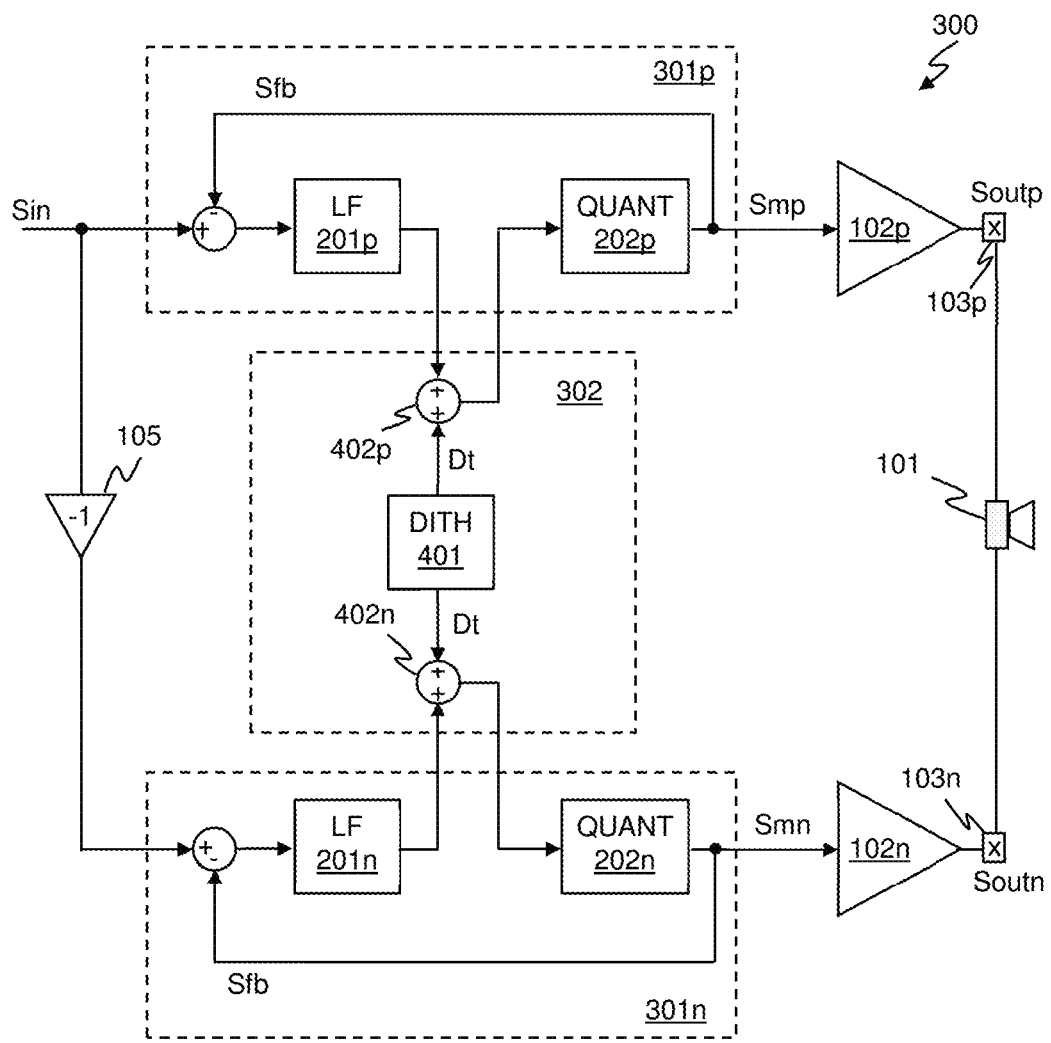
FIG. 4 illustrates an amplifier arrangement with a correlation controller configured to apply common dither to first and second signal paths.

FIG. 4 illustrates an embodiment of the amplifier circuit 300 which shows one example of the correlation controller 302 for applying correlated dither to the first and second SDMs 301p and 301n. As discussed with reference to FIG. 2, each of the first and second SDMs 301p and 301n comprises a respective loop filter 201p and 201n and quantizer 202p and 202n, with negative feedback from the output of the SDM. In the embodiment of FIG. 4, however, the correlation controller 302 is configured such that a dither signal Dt is applied to each of the first and second SDMs.

The correlation controller 302 in this embodiment thus comprises a dither generator 401 which operates to generate a common dither signal Dt. The dither generator 401 may generate the dither signal in any convenient way, for instance the dither generator 401 may comprise a linear feedback shift register (LFSR) which allows for generation of dither in a relatively low-power manner. In some examples the dither may be generated to have a generally flat spectrum, although in some case some shaping may be applied to the dither, e.g. by filtering to provide HPDF (high-pass probability density function) dither. One skilled in the art will be aware of other ways that suitable dither may be generated, e.g. using a Mersenne twister or the like.

The common dither signal Dt is applied to the relevant SDM 301p or 301n in the forward signal path between the loop filter 201n/201p and the quantizer 202p/202n. In the example of FIG. 4 the correlation controller 302 is arranged to receive the outputs of the loop filters 201n and 201p and comprises adders 402p and 402n for adding the dither signal Dt before input to the respective quantizer 202p or 202n.

In this way the dither applied to both SDMs is correlated. In effect, if the dither is seen as a deliberately added noise component, a common noise component is deliberately added to the modulated signal Smp and the modulated signal Smn. As the dither is added within the feedback loop of the SDM it forms part of the noise spectrum of the output of the SDM and hence the driving signals Soutp and Soutm, but as this component is common to both driving signals it does not appear differentially across the load.

Figure 5:
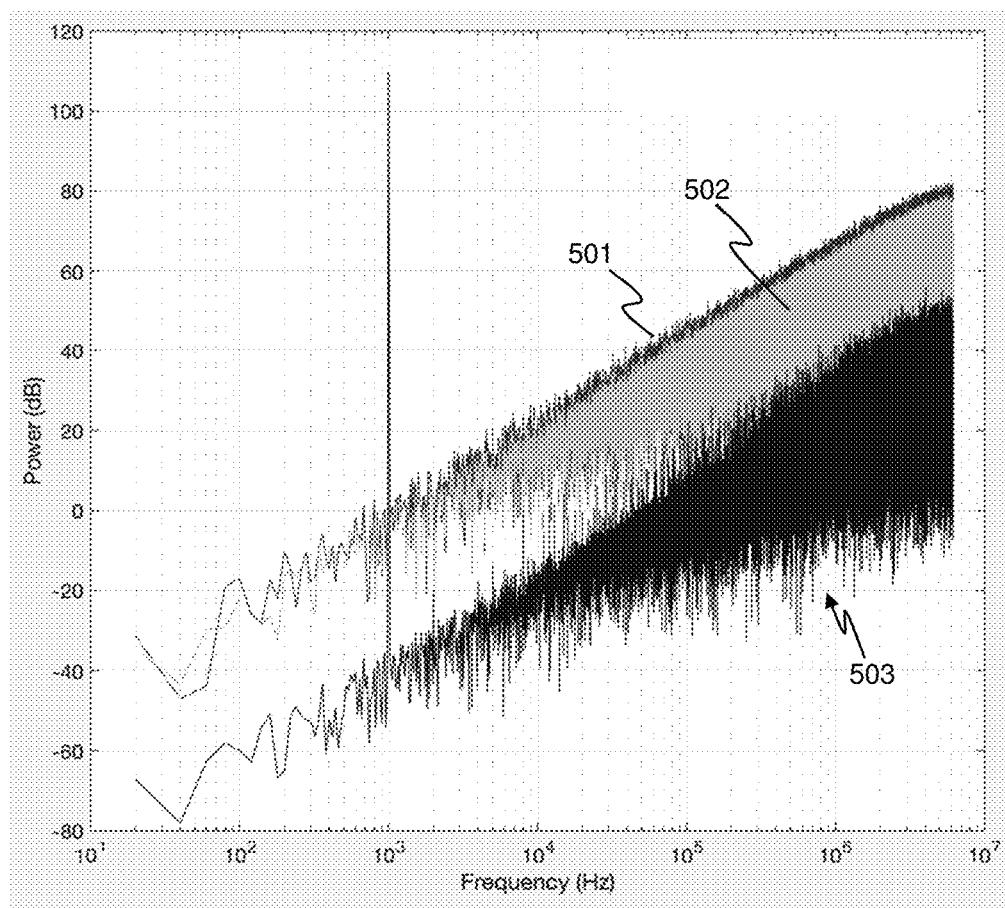
FIG. 5 illustrates output power spectra for three different amplifier arrangements.

FIG. 5 illustrates the spectrum of output power (i.e. power of the output signal Vout across the bridge tied load) against frequency for three different simulated scenarios, in each case assuming the input signal was a 1 kHz sine wave.

Plot 501 (the uppermost dark plot) illustrates the spectrum for the conventional approach, illustrated in FIG. 1, where the output from a single SDM is used to derive the driving signals Soutp and Soutn to drive the load. As would be expected there is a peak of output power at the input signal frequency of 1 kHz and a spread of power in other frequencies, with increasing power at higher frequencies.

For comparison, plot 502 (the lighter, grey, plot) shows the spectrum for a scenario where first and second SDMs are used to generate respective modulated signals to provide the driving signals Soutp and Soutn to drive the load and dither is applied to the SDMs, but there is no deliberate correlation applied, i.e. the dither applied to the first and second SDMs is independent. In this case, with two SDMs and dither applied, but the driving signals being uncorrelated, there is a greater spread of outer power with frequency at higher frequencies, but the peak output power is substantially the same as for the conventional approach.

Plot 503 (the lower dark plot) shows the spectrum for the embodiment of FIG. 4, where first and second SDMs are used to generate respective modulated signals and common dither is applied to the SDMs, so there is at least some correlation introduced into the high frequency content of the driving signals Soutp and Soutn. Plot 503 illustrates that there remains a peak of output power at the input signal frequency of 1 kHz, but there is a significant drop in output power of noise across the frequency range.

It will therefore be seen that applying a common dither to the first and second SDMs provides at least some correlation to the driving signals Soutp and Soutn, which thus reduces the power across the load due to noise from the SDM.

In some embodiments the correlation controller 302 may additionally or alternatively be configured to provide cross-coupling between the first and second SDMs, i.e. to introduce a component into the second driving signal Soutn based on the content of the first driving signal Soutp and vice versa. In some examples the correlation controller 302 may thus be configured to introduce a component into the second modulated signal Smn based on the noise in the first modulated signal Smp and vice versa. In this way the first driving signal Soutp will include a component that is correlated with noise in the second driving signal Soutn and thus this component will be common to both driving signals and will not contribute to the differential power across the load. Likewise, the second driving signal Soutn will include a component that is correlated with noise in the first driving signal Soutp.

Figure 6:
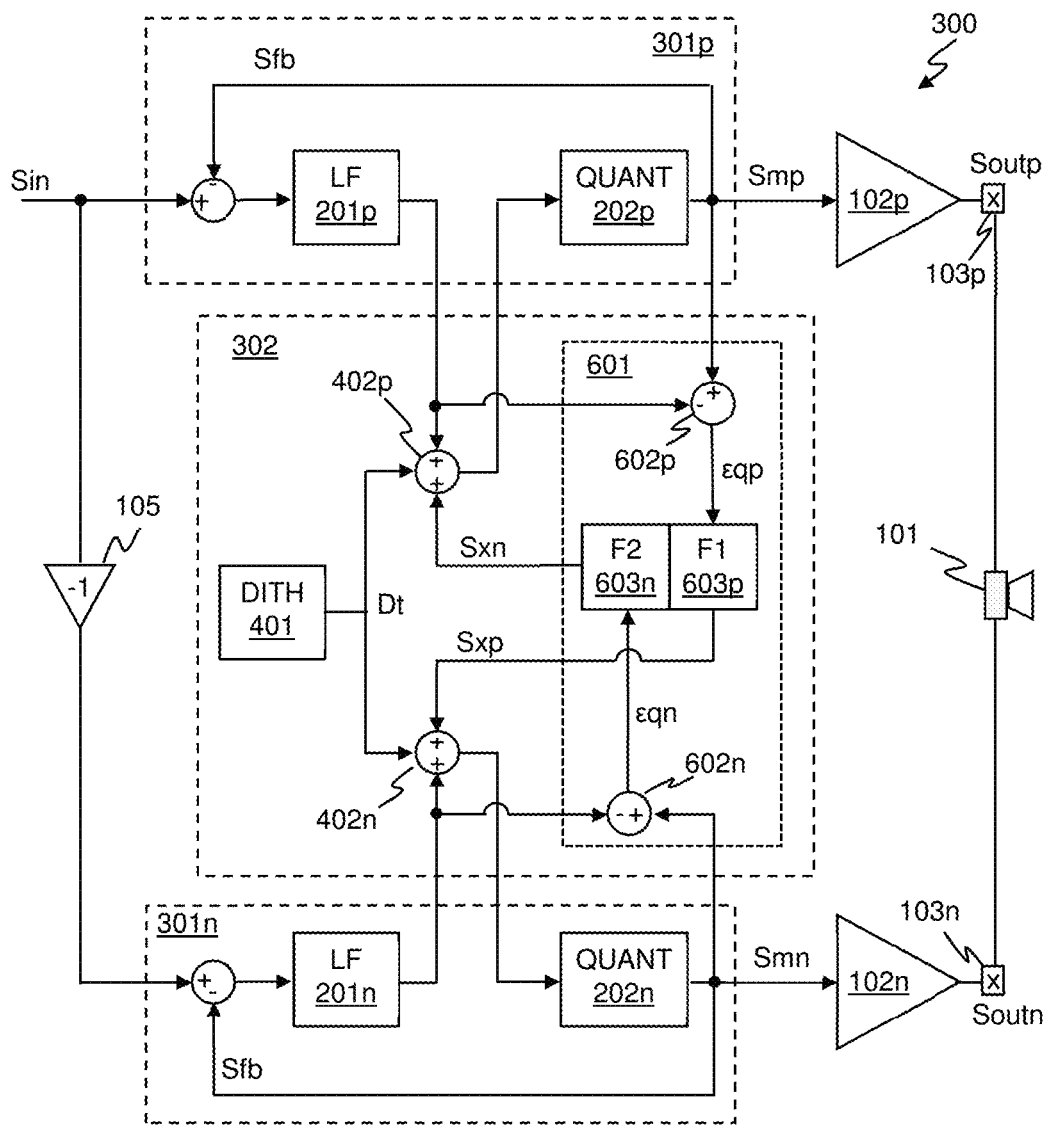
FIG. 6 illustrates an amplifier arrangement with a correlation controller configured to apply cross-coupling to first and second signal paths.

FIG. 6 illustrates an embodiment of an amplifier circuit 300 in which the correlation controller 302 applies cross-coupling, and thus includes a cross-coupler 601. In this embodiment the cross-coupling is based on quantization error. For each of the first and second SDMs 301p and 302p, the cross-coupler 601 is configured to determine a respective quantization error $\varepsilon qp$ or $\varepsilon qn$ based on the input and the output of the respective quantizer. FIG. 6 thus illustrates that adder 602p receives the output of the quantizer 202p and subtracts the output of the loop filter 201p to provide the quantization error signal $\varepsilon qp$, and that adder 602n operates in a similar way to provide the quantization error signal $\varepsilon qn$.

Functions F1 and F2, which may generally be the same as one another, are applied to the respective quantization $\varepsilon qp$ or $\varepsilon qn$ signals by processing modules 603p and 603n. In general, the functions F1 and F2 may apply some filtering to the relevant quantization error signal to provide some desired shaping to the spectrum and also provide some scaling according to a coupling coefficient C to control the strength of the cross coupling.

Figure 7:
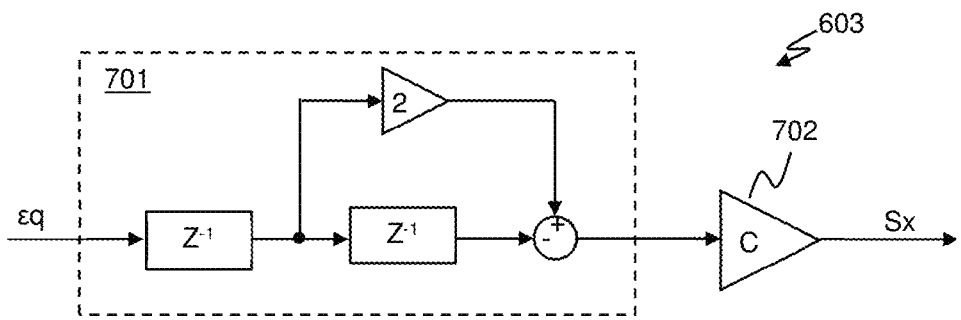
FIG. 7 illustrates one example of a processing module for generating a cross-coupling signal.

FIG. 7 illustrates one example of a processing module 603 which includes a filter 701 for filtering the relevant quantization error signal $\varepsilon q$ and a gain element 702 for scaling the filtered error signal according to the coupling coefficient C. In this example the filter 701 is illustrated as a second order filter which applies a gain to a delayed sample and subtracts the previous sample to provide a filter function $2*Z^{-1}-Z^{-2}$. It will be understood however that other filters could be used and the filter, in some embodiments could be a first or other order filter.

As noted, the filter can provide some desired spectral shaping and thus allows for shaping of the noise transfer function of the amplifier, in addition to the shaping provided by the loop filter. For instance, a second or higher order filter may be used to provide increased correlation at higher frequencies, and thus to reduce the differential power in the driving signals at such frequencies.

The filtered error signal is then scaled by the coupling coefficient C, which is set to provide a desired strength of cross-coupling between the differential signal paths i.e. a desired strength of coupling between the quantizers 202p and 202n of the first and second SDMs. The coupling coefficient C should be set so that there is sufficient coupling to reduce the out of band power in the resultant differential signal, but not so high as to have any detrimental impact on the actual differential signal components of interest. An appropriate level of coupling coefficient may be determined, e.g. at design or manufacturing stage, by analysis and/or testing, e.g. sweeping the coefficient through a range of values with different inputs to determine suitable values.

Referring back to FIG. 6, the output of the processing module 603p is thus a cross-coupling signal Sxp indicative of the quantisation error of the first SDM. This cross-coupling signal component is added, by adder 402n, to the input of the quantizer 202n of the second SDM 301n. Likewise, the output of processing module 603n is a cross-coupling signal Sxn indicative of the quantisation error of the second SDM, which is added, by adder 402p, to the input of the quantizer 202p of the first SDM 301n. This cross-coupling thus means that there is coupling of the quantization errors between the quantizers 202p and 202n of the first and second SDMs 301p and 301n, which results in coupling between the respective output modulated signals Smp and Smn and hence the driving signals.

FIG. 7 illustrates that the correlation controller may also comprise a dither generator 401 which is arranged to provide a common dither signal Dt which may also be added, by adders 402p and 402n, to the inputs to the quantizers 202p and 202n in a similar manner as discussed above with respect to FIG. 4. It will be understood however the correlation controller 302 could comprise a cross-couple 601, but independent dither could be applied to the first and second SDMs.

Note that FIG. 6 illustrates that the quantization error, $\varepsilon yp$ or $\varepsilon qn$ is determined based on the difference between the output of the relevant quantizer and the input to that quantizer before the dither is added. It would, alternatively, be possible to determine the quantization error based on the difference between the input to the quantizer to which any dither has been applied, in which case the dither would appear unshaped at the inputs to the filters 603p and 603n.

Embodiments of the disclosure thus relate to amplifier arrangements for driving a bridge-tied-load with differential driving signals. Embodiments relate to amplifier arrangements in which respective SDMs are provided in the respective signal paths for the differential driving signals and in which a correlation controller is configured to introduce at least some correlation i.e. coupling, between noise components of the driving signals. This means that at least some noise is common to both driving signals and does not appear differentially across the load. This approach can thus reduce the power dissipation across the load due to noise, compared to conventional amplifier arrangements. In some examples the correlation controller may apply common dither to each of the SDMs. In some examples the correlation controller may apply cross-coupling between the SDMs.

The description has also focused on driving audio output transducers. This may include transducers such as loudspeakers for generating audible sounds, but may also include ultrasonic or other similar transducers and/or haptic transducers. Embodiments also relate to amplifier circuits for driving other types of transducers. Embodiments may particularly be useful for driving transducers with relatively low load impedances, e.g. piezo output transducers.

Embodiments may be advantageously implemented as part of audio processing circuitry, e.g. for audio amplifiers for providing audio driving signals to audio output transducers such as loudspeakers, which may be transducers of a host device and/or transducers of an accessory apparatus which may be removably connected to the host device in use.

Embodiments may be arranged as part of an audio and/or signal processing circuit, for instance an audio circuit such as a codec which may be provided in a host device. A circuit according to an embodiment of the present invention may be implemented as an integrated circuit.

Embodiments may be incorporated in a host electronic device, which may for example be a portable device and/or a device operable with battery power. The host device could a device with one or more loudspeaker provided as part of the host device and/or a connector for making a wired connection with a loudspeaker of a removable accessory apparatus that may be removably connected to the host device in use. The host device may include a wireless communication module for receiving input data. The host device could be a communication device such as a mobile telephone or smartphone or similar, a computing device such as notebook, laptop or tablet computing device, a wearable device such as a smartwatch. The host device could alternatively be an accessory device for use with any such communication, computing or wearable device. For instance the host device could be a headset or earbud or similar The skilled person will recognise that some aspects of the above-described apparatus and methods, may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. An amplifier circuit for, in use, driving a load connected between first and second output nodes with respective first and second driving signals based on an input signal, the amplifier circuit comprising:
a first signal path for generating the first driving signal at the first output node, the first signal path comprising a first sigma-delta modulator;
a second signal path for generating the second driving signal at the second output node, the second signal path comprising a second sigma-delta modulator; and
a correlation controller for controlling the first and second signal paths to provide correlation between at least some noise components of the first and second driving signals.

2. The amplifier circuit of claim 1 wherein the correlation controller comprises a cross-coupler configured to:
generate a first cross-coupling signal based on signal content of the first signal path;
generate a second cross-coupling signal based on signal content of the second signal path;
add the first cross-coupling signal to the second signal path; and
add the second cross-coupling signal to the first signal path.

3. The amplifier circuit of claim 2 where each of the first and second sigma-delta modulators comprises a respective loop filter and a quantizer.

4. The amplifier circuit of claim 3 wherein the cross-coupler is configured to generate the first cross-coupling signal based on a first quantization error signal derived from the first signal path and to generate the second cross-coupling signal based on a second quantization error signal derived from the second signal path.

5. The amplifier circuit of claim 4 wherein the cross-coupler is configured to derive the first and second quantization error signals by determining a difference between an output of the loop filter and an output of the quantizer for the respective first and second sigma-delta modulators.

6. The amplifier circuit of claim 4 wherein the cross-coupler comprises first and second processing modules for applying a defined function to the first and second quantization error signals respectively to generate the respective first and second cross-coupling signals.

7. The amplifier circuit of claim 6 wherein each of the first and second processing modules comprises a filter for filtering the relevant quantization error signal and a gain element for applying a gain based on a predefined coupling coefficient.

8. The amplifier circuit of claim 3 wherein the cross-coupler is configured to:
add the first cross-coupling signal to the second signal path between the loop filter and quantizer of the second sigma-delta modulator; and
add the second cross-coupling signal to the first signal path between the loop filter and quantizer of the first sigma-delta modulator.

9. The amplifier circuit of claim 1 wherein the correlation controller is configured to apply a common dither signal to the first and second signal paths.

10. The amplifier circuit of claim 9 comprising a dither generator for generating the common dither signal.

11. The amplifier circuit of claim 9, wherein each of the first and second sigma-delta modulators comprises a respective loop filter and a quantizer and the correlation controller is configured to add the common dither signal to the respective first and second signal path between the loop filter and quantizer of the first and second sigma-delta modulators respectively.

12. The amplifier circuit of claim 1 wherein the first and second signal paths are coupled to an input node for receiving the input signal and the second signal path comprises an inverter upstream of the second sigma-delta modulator.

13. The amplifier circuit of claim 1 wherein the first and second signal paths comprise respective first and second output drivers between the respective first and second sigma-delta modulator and the respective first and second output node.

14. The amplifier circuit of claim 13 wherein the first and second output drivers comprise class-D output stages.

15. The amplifier circuit of claim 1 implemented as an integrated circuit.

16. The amplifier circuit of claim 1 further comprising an output transducer connected between the first and second output nodes.

17. The amplifier circuit of claim 16 wherein the output transducer comprises a piezoelectric output transducer.

18. An electronic device comprising the amplifier circuit of claim 1.

19. An amplifier circuit for, in use, driving a load connected between first and second output nodes with respective first and second driving signals based on an input signal, the amplifier circuit comprising:
- a first signal path for generating the first driving signal, the first signal path comprising a first sigma-delta modulator with a first loop filter and a first quantizer;
- a second signal path for generating the second driving signal at the second output node, the second signal path comprising a second sigma-delta modulator with a second loop filter and a second quantizer; and
- a cross-coupler configured to:
  - add a first coupling signal derived from the first sigma-delta modulator to an input of the second quantizer; and
  - add a second coupling signal derived from the second sigma-delta modulator to an input of the first quantizer.

20. An amplifier circuit for, in use, driving a load connected between first and second output nodes with respective first and second driving signals based on an input signal, the amplifier circuit comprising:
- a first signal path for generating the first driving signal, the first signal path comprising a first sigma-delta modulator;
- a second signal path for generating the second driving signal at the second output node, the second signal path comprising a second sigma-delta modulator; and
- a correlation controller configured to apply a common dither signal to the first and second sigma-delta modulators.

* * * * *

UNITED STATES PATENT AND TRADEMARK OFFICE
CERTIFICATE OF CORRECTION

| | |
|---|---|
| PATENT NO. | : 11,233,487 B1 |
| APPLICATION NO. | : 17/014283 |
| DATED | : January 25, 2022 |
| INVENTOR(S) | : John Paul Lesso |

It is certified that error appears in the above-identified patent and that said Letters Patent is hereby corrected as shown below:

In the Specification

1. In Column 1, Line 34, delete "by" and insert -- be --, therefor.

2. In Column 1, Line 65, delete "increasing" and insert -- increasingly --, therefor.

3. In Column 2, Line 15-17, delete "a first signal path for generating the first driving signal at the first output node, the first signal path comprising a first sigma-delta modulator;" and insert the same at Line 16, as a new sub point.

4. In Column 4, Line 61, delete "second driver 102p." and insert -- second driver 102n. --, therefor.

5. In Column 5, Line 12, delete "as at" and insert -- at --, therefor.

6. In Column 5, Lines 18-19, delete "second driver 102p." and insert -- second driver 102n. --, therefor.

7. In Column 7, Line 28, delete "SDMs 301p and 302p," and insert -- SDMs 301p and 301n, --, therefor.

8. In Column 9, Line 8, delete "could" and insert -- could be --, therefor.

9. In Column 9, Line 22, delete "similar" and insert -- similar. --, therefor.

In the Claims

10. In Column 10, Line 15, in Claim 3, delete "where" and insert -- wherein --, therefor.

Signed and Sealed this
Twenty-ninth Day of August, 2023

*Katherine Kelly Vidal*
Katherine Kelly Vidal
*Director of the United States Patent and Trademark Office*